(12) United States Patent
Cho et al.

(10) Patent No.: US 12,002,518 B2
(45) Date of Patent: Jun. 4, 2024

(54) MEMORY DEVICE PERFORMING TEMPERATURE COMPENSATION AND OPERATING METHOD THEREOF

(71) Applicant: SAMSUNG ELECTRONICS CO., LTD., Suwon-si (KR)

(72) Inventors: Yongsung Cho, Hwaseong-si (KR); Kyoman Kang, Gunpo-si (KR); Minhwi Kim, Hwaseong-si (KR); Ilhan Park, Suwon-si (KR); Jinyoung Chun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 118 days.

(21) Appl. No.: 17/710,283

(22) Filed: Mar. 31, 2022

(65) Prior Publication Data

US 2023/0055963 A1 Feb. 23, 2023

(30) Foreign Application Priority Data

Aug. 18, 2021 (KR) .................. 10-2021-0108964

(51) Int. Cl.
*G11C 16/00* (2006.01)
*G11C 16/04* (2006.01)
(Continued)

(52) U.S. Cl.
CPC .......... *G11C 16/24* (2013.01); *G11C 16/0483* (2013.01); *G11C 16/26* (2013.01)

(58) Field of Classification Search
CPC ..... G11C 16/24; G11C 16/26; G11C 16/0483; G11C 16/10; G11C 16/3459; G11C 16/08;
(Continued)

(56) References Cited

U.S. PATENT DOCUMENTS 6,870,766 B2 3/2005 Cho et al.
7,379,337 B2 5/2008 Park
(Continued)

FOREIGN PATENT DOCUMENTS

KR 1020040006933 A 1/2004
KR 100476888 B1 3/2005
(Continued)

*Primary Examiner* — Thong Q Le
(74) *Attorney, Agent, or Firm* — Sughrue Mion, PLLC

(57) ABSTRACT

A memory device is provided. The memory device includes: a memory cell array including a plurality of memory cells; a page buffer circuit connected to the memory cell array through a plurality of bit lines and including a page buffer connected to each of the plurality of bit lines, the page buffer including at least one first latch for storing data based on a voltage level of a first sensing node; and a control circuit configured to adjust a level of a voltage signal provided to the page buffer circuit. The page buffer includes a trip control transistor arranged between the at least one first latch and the first sensing node, and wherein the control circuit is further configured to, based on a read operation being performed on the memory cell array, control a trip control voltage to be provided to a gate of the trip control transistor. A level of the trip control voltage varies according to a temperature of the memory device.

20 Claims, 13 Drawing Sheets

(51) Int. Cl.
*G11C 16/24* (2006.01)
*G11C 16/26* (2006.01)

(58) Field of Classification Search
CPC ....... G11C 7/24; G11C 16/30; G11C 11/5642;
G11C 16/32; G11C 7/04; G11C 7/12;
G11C 11/5628; G11C 7/065; G11C
16/14; G11C 16/3404; G11C 7/1048;
G11C 7/106; G11C 11/5635; G11C
11/5671; G11C 16/3436; G11C 16/3445;
G11C 2029/0409; G11C 2029/0411;
G11C 2211/5642; G11C 29/52; G11C
5/02; G11C 5/14; G11C 7/1057; G11C
16/3481; G11C 7/1039; G11C 7/1087;
G11C 8/08; G11C 8/10; G11C 16/102;
G11C 16/3409; G11C 2207/2281; G11C
2216/14; G11C 5/147; G11C 7/1084;
G11C 7/18; G06F 11/1048; G06F
11/1068; G06F 12/0246; G06F 12/0882
See application file for complete search history.

(56) References Cited

U.S. PATENT DOCUMENTS 7,443,733 B2　10/2008　Park
10,290,343 B2 *　5/2019　Kim ........................ G11C 16/26

FOREIGN PATENT DOCUMENTS

| KR | 100694972 B1 | 3/2007 |
| KR | 100842996 B1 | 7/2008 |
| KR | 1020100013953 A | 2/2010 |

* cited by examiner

MEMORY DEVICE PERFORMING TEMPERATURE COMPENSATION AND OPERATING METHOD THEREOF

CROSS-REFERENCE TO RELATED APPLICATION

This application claims priority to Korean Patent Application No. 10-2021-0108964, filed on Aug. 18, 2021, in the Korean Intellectual Property Office, the disclosure of which is incorporated by reference herein in its entirety.

BACKGROUND

Methods, apparatuses and systems consistent with example embodiments relate to a memory device, and more particularly, to a page buffer performing temperature compensation and a memory device including the same.

As additional functionality is provided to information and communication devices, there is a demand for increased capacity and increased integration of memory devices. A memory device may include a page buffer connected to bit lines of memory cells for storing data therein or outputting data from the memory cells, and the page buffer may include semiconductor devices such as transistors.

The operating characteristics of a memory cell (e.g., the level of current flowing through the memory cell, etc.) may be changed according to the temperature change of the memory device, and the reliability of data sensed by the page buffer may be deteriorated as operating characteristics are changed. As an example, the level of the current flowing through the memory cell may decrease as the temperature decreases in the data read operation. To compensate for the reduced level of current, the voltage level of the bit lines may be increased. However, because there is a restriction in the increased voltage level of the bit lines, the compensation is limited.

SUMMARY

One or more example embodiments provide a page buffer capable of improving read performance degradation caused by a decrease in cell current due to a decrease in the temperature of a memory device, and a memory device including the same.

According to an aspect of an example embodiment, a memory device includes: a memory cell array including a plurality of memory cells; a page buffer circuit connected to the memory cell array through a plurality of bit lines and including a page buffer connected to each of the plurality of bit lines, the page buffer including at least one first latch for storing data based on a voltage level of a first sensing node; and a control circuit configured to adjust a level of a voltage signal provided to the page buffer circuit. The page buffer includes a trip control transistor arranged between the at least one first latch and the first sensing node, and wherein the control circuit is further configured to, based on a read operation being performed on the memory cell array, control a trip control voltage to be provided to a gate of the trip control transistor. A level of the trip control voltage varies according to a temperature of the memory device.

According to an aspect of an example embodiment, a page buffer of a memory device is provided. The page buffer is arranged to correspond to a first bit line of a plurality of bit lines of the memory device, and includes: a first latch configured to latch data based on a voltage level of a first sensing node of the page buffer; a shut off transistor connected to the first bit line and configured to operate based on a shut-off control signal; a bit line connection transistor arranged between the shut off transistor and the first sensing node and configured to operate based on a bit line connection control signal; a bit line clamping transistor arranged between a first node and a power supply voltage, wherein the bit line clamping transistor is configured to operate based on a bit line clamping control signal, and the first node is arranged between the shut off transistor and the bit line connection transistor; and a trip control transistor arranged between the first latch and the first sensing node, and configured to operate based on a trip control voltage. The page buffer is configured to control, as a temperature of the memory device decreases, a level of any one or any combination of the shut-off control signal, the bit line connection control signal, and the bit line clamping control signal to increase, and the page buffer is configured to control, as the level of the trip control voltage increases, a sensing trip level of the page buffer to increase.

According to an aspect of an example embodiment, a memory device includes: a memory cell array including a plurality of memory cells; a page buffer circuit connected to the memory cell array through a plurality of bit lines and including a page buffer connected to one of the plurality of bit lines, the page buffer including at least one first latch configured to store data based on a voltage level of a sensing node; and a control circuit configured to adjust a level of a voltage signal provided to the page buffer circuit. The page buffer further includes one or more transistors connected between a corresponding bit line and the sensing node, and a trip control transistor arranged between the sensing node and the at least one first latch, and the control circuit is further configured to, as a temperature of the memory device decreases, control a level of a trip control voltage applied to a gate of the trip control transistor to increase.

BRIEF DESCRIPTION OF THE DRAWINGS

The above and other aspects will be more apparent from the following description of example embodiments taken in conjunction with the accompanying drawings, in which.

DETAILED DESCRIPTION

Hereinafter, example embodiments will be described in detail with reference to the accompanying drawings.

Figure 1:
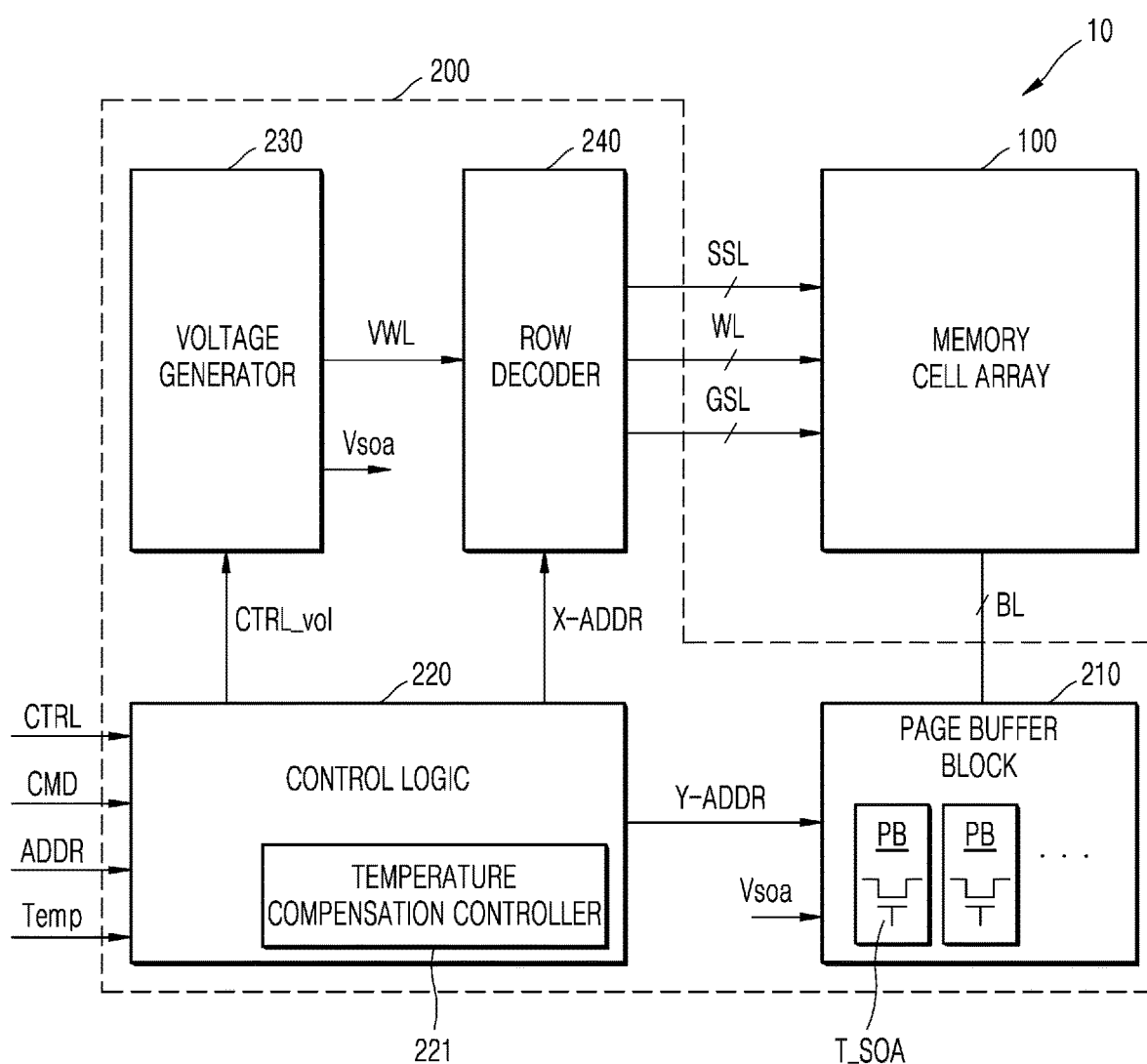
FIG. 1 is a block diagram illustrating a memory device according to an embodiment.

FIG. 1 is a block diagram illustrating a memory device 10 according to an example embodiment.

Referring to FIG. 1, the memory device 10 may include a memory cell array 100 and a peripheral circuit 200, and the peripheral circuit 200 may include a page buffer block 210, a control logic 220, a voltage generator 230, and a row decoder 240. The peripheral circuit 200 may further include various other components related to a memory operation, such as a column logic, a pre-decoder, a temperature sensor, a command decoder, an address decoder, and an input/output interface.

The memory cell array 100 may be connected to the page buffer block 210 through bit lines BL, and may be connected to the row decoder 240 through word lines WL, string select lines SSL, and ground select lines GSL. The memory cell array 100 may include a plurality of memory cells, and for example, the memory cells may be flash memory cells. Hereinafter, example embodiments will be described in detail by taking a case where a plurality of memory cells are NAND flash memory cells as an example. However, example embodiments are not limited thereto, and in some example embodiments, the plurality of memory cells may be resistive memory cells such as resistive RAM (ReRAM) memory cells, phase change RAM (PRAM) memory cells, ferroelectric RAM (FRAM) memory cells, or magnetic RAM (MRAM) memory cells.

In one example embodiment, the memory cell array 100 may include a three-dimensional cell array, and the three-dimensional cell array may include a plurality of NAND strings, and each NAND string may include memory cells respectively connected to word lines stacked vertically on a substrate.

The control logic 220 may output various control signals for writing or programming data to or on the memory cell array 100, reading data from the memory cell array 100, or erasing data stored in the memory cell array 100, for example, a voltage control signal CTRL_vol, a row address X-ADDR, and a column address Y-ADDR, based on the command CMD, the address ADDR, and the control signal CTRL. Accordingly, the control logic 220 may control various operations in the memory device 10 as a whole.

The voltage generator 230 may generate various types of voltages used to perform program, read, and erase operations on the memory cell array 100 based on the voltage control signal CTRL_vol. In particular, the voltage generator 230 may generate a word line voltage, for example, a program voltage, a read voltage, a pass voltage, an erase verification voltage, or a program verification voltage. Also, the voltage generator 230 may further generate a string select line voltage and a ground select line voltage based on the voltage control signal CTRL_vol. In addition, the voltage generator 230 may generate one or more voltages for driving or controlling the page buffer block 210, and according to example embodiments, may generate the trip control voltage Vsoa provided to the gate of the trip control transistor T_SOA provided in each page buffer PB of the page buffer block 210.

The row decoder 240 may perform a selection operation on a plurality of word lines WL and a selection operation on a plurality of string select lines SSL according to the row address X-ADDR. Also, the page buffer block 210 may select at least one bit line from among the bit lines BL according to the column address Y-ADDR. Each page buffer PB of the page buffer block 210 may operate as a write driver or a sense amplifier according to an operation mode.

The page buffer block 210 may include a plurality of page buffers PB respectively connected to a plurality of bit lines BL. Each of the page buffers PB may be connected to a corresponding bit line BL among the plurality of bit lines BL. The page buffer block 210 may temporarily store data read from the memory cell array 100 or temporarily store data to be written to the memory cell array 100. For example, each of the page buffers PB may include one or more latches. Each of the latches may temporarily store data.

As an implementation example, at least one latch among a plurality of latches provided in each page buffer PB may be connected to a sensing node. As an example, a bit line and a sensing node may be precharged during a data read operation, and in a development period in which the voltage of the sensing node develops according to the logic state of the data stored in the memory cell, data may be stored in a latch connected to the sensing node according to a change in the voltage of the sensing node.

Assuming that data is stored in the sensing latch through a read operation among a plurality of latches of the page buffer PB, a sensing trip level (or sensing trip range) for a latch in which data is stored may be defined, and as the voltage of the developed sensing node differs from (i.e., is less than or greater than) the sensing trip level, data of different logic states may be stored in the sensing latch. For example, the sensing trip level may correspond to a level at which data is flipped according to characteristics of transistors (e.g., PMOS and NMOS transistors) provided in the sensing latch, and the sensing trip level may be changed according to characteristics of the PMOS and NMOS transistors. According to an example embodiment, a trip control transistor T_SOA may be included in the page buffer PB, and a trip control voltage Vsoa may be provided to a gate of the trip control transistor T_SOA to control the sensing trip level. For example, as the trip control voltage Vsoa increases, the sensing trip level increases, and the control operation may be performed in such a way that the sensing trip level decreases as the trip control voltage Vsoa decreases.

In example embodiments, the trip control transistor T_SOA is a transistor included in a page buffer operating as a sense amplifier in a data read operation, and may be referred to as a sense out amplification transistor.

Because the sensing latch is not directly connected to the sensing node, but is connected to the sensing node through the trip control transistor T_SOA described above, the sensing trip level of the sensing latch may be changed based on the trip control voltage Vsoa applied to the trip control transistor T_SOA. For example, the voltage level of the sensing node causing the data of the sensing latch to be flipped may correspond to the voltage level causing the trip control transistor T_SOA to be turned on, and the sensing trip level may correspond to a value (Vsoa−Vth) obtained by subtracting the threshold voltage Vth of the trip control transistor T_SOA from the level of the trip control voltage Vsoa. Accordingly, when the level of the trip control voltage Vsoa increases, the trip level of the sensing latch may increase.

In addition, the charge trap flash (CTF)-based memory cells included in the memory cell array 100 may have a characteristic that the cell current decreases as the temperature decreases. In addition, when the memory device 10 has a structure of a vertical NAND including a plurality of stacks, the channel resistance increases, and accordingly, the level of the cell current flowing through the memory cells may be further decreased. A method of increasing the level vBL of the bit line may be performed to compensate for the decrease in cell current as described above. For example, as a method of increasing a level vBL of a bit line, a level of a gate bias applied to various transistors (e.g., a shut-off transistor, a bit line clamping transistor, a bit line connection transistor, etc.) connected to the sensing node may be increased.

However, when the levels of the gate bias of the various transistors as described above are controlled to increase, the voltage level of the sensing node increases accordingly. However, in the case of the page buffer PB connected to the unselected bit line BL, the voltage level of the sensing node (e.g., the non-selected sensing node) needs to be lower than the sensing trip level. As the margin between the unselected sensing node and the sensing trip level decreases due to the increase of the gate bias level, a sensing fail may occur. Thus, to maintain a margin between the non-selected sensing node and the sensing trip level, there is a limit to increasing the level of the gate bias. Therefore, a limit arises in properly compensating for a decrease in cell current due to temperature change.

Figure 6A:
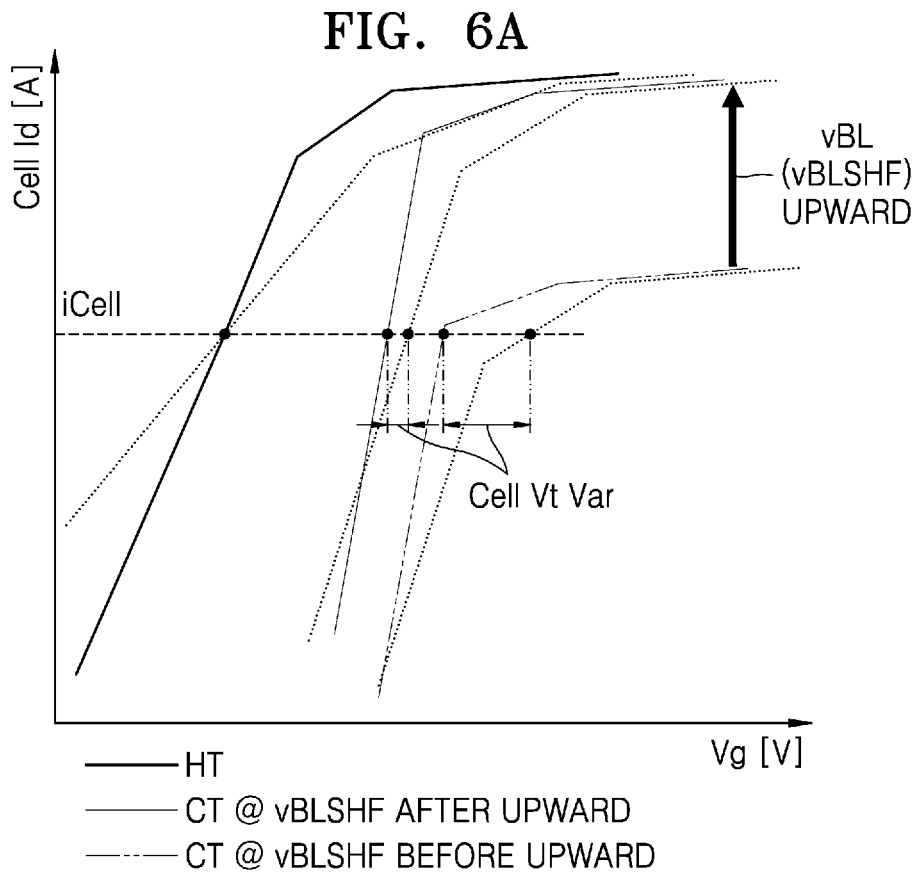
FIGS. 6A and 6B are diagrams illustrating a change in cell current and a sensing trip level according to temperature according to an example embodiment.
Figure 6B:
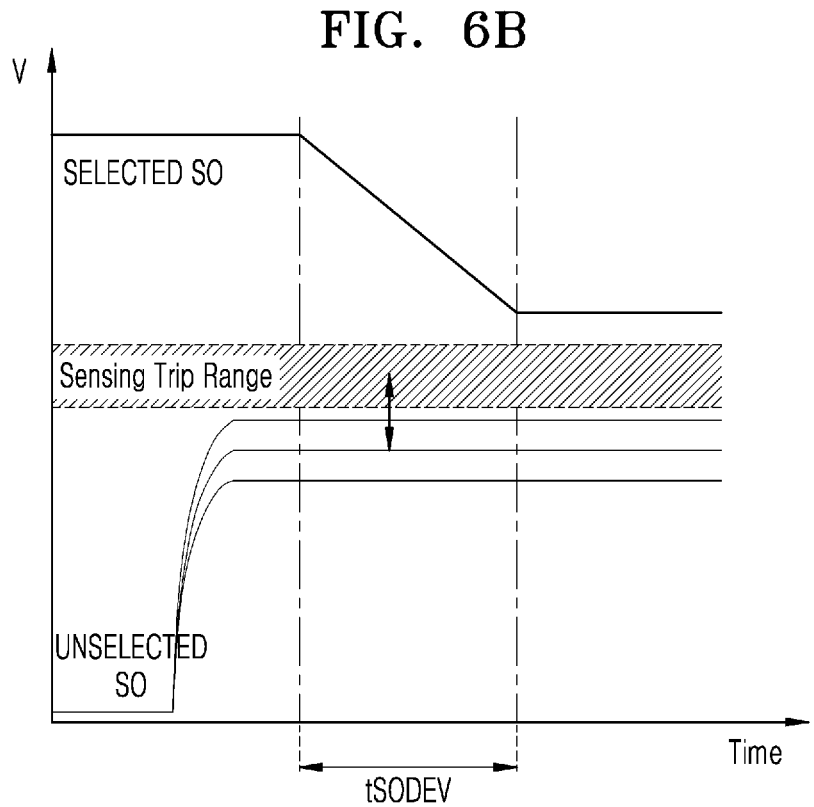

A description related to the fluctuation of the cell current according to the temperature and the sensing trip level is described with reference to FIGS. 6A and 6B as follows. FIGS. 6A and 6B are diagrams illustrating an example of a change in cell current and a sensing trip level according to temperature. Also, FIG. 6A exemplifies a case where the voltage level of the shut-off control signal BLSHF applied to the shut-off transistor increases as the temperature decreases.

Referring to FIG. 6A, in a CTF-based vertical NAND (VNAND) cell, the cell current Id decreases as the temperature decreases. For example, each of the memory cells may have a voltage Vg-cell current Id characteristic as shown in FIG. 6A, depending on the program state of the adjacent cells, the change amount (slope) of the cell current Id may be large, or the change amount may be relatively gentle as shown by a dashed line. That is, when determining data based on a particular sensing reference current iCell, the level of the cell current Id may be changed according to the program state of the adjacent cell, which results in an increase in the distribution width of the threshold voltage.

As shown in FIG. 6A, in the case of reading memory cells at a high temperature HT, when data is determined based on a particular sensing reference current iCell, a distribution width (e.g., a threshold voltage deviation) may be relatively small. On the other hand, when reading memory cells at a low temperature CT without increasing the level of the bit line (the level vBLSHF of the bit line shut-off signal is exemplified in FIG. 6A), as shown by the dashed line, the distribution width of the threshold voltage is relatively increased according to the program state of the adjacent cells, which is a factor of lowering the accuracy of data sensing. Accordingly, to improve the increase in the distribution width of the memory cells as the temperature is lowered, as the temperature decreases, it is necessary to increase the voltage level of the bit line, and FIG. 6A shows an example in which the distribution width of the threshold voltage is decreased when the level vBLSHF of the shut-off signal is increased.

On the other hand, FIG. 6B shows an example of a change in the voltage level of the selected sensing node SO and the non-selected sensing node, and after the selected sensing node is precharged to a preset level, the level may be changed differently according to data stored in the memory cell in the development period tSODEV. In FIG. 6B, a case is exemplified that the voltage level of the selected sensing node in the development period tSODEV is higher than the sensing trip level (or sensing trip range) according to the data, and the voltage level of the selected sensing node may be lower than the sensing trip level according to data stored in the memory cell.

On the other hand, the voltage level of the unselected sensing node may increase according to the gate bias, and for example, as the level of the gate bias applied to the shut-off transistor, the bit line clamping transistor, the bit line connection transistor, etc. increases, as shown in FIG. 6B, the voltage level of the unselected sensing node may be increased. That is, as described above, when the margin between the voltage level of the non-selected sensing node and the sensing trip level decreases, errors may occur in the data sensing process, and accordingly, there is an issue in increasing the bit line level by increasing the gate bias.

Referring back to FIG. 1, according to an example embodiment, at least one trip control transistor T_SOA may be arranged in each page buffer PB, and a trip control voltage Vsoa may be provided to the gate of the trip control transistor T_SOA. For example, the level of the trip control voltage Vsoa may be changed according to a change in temperature. For example, the memory device 10 may be provided with a temperature sensor for sensing a temperature. The temperature sensor may generate temperature information Temp indicating temperature of the memory device 10, and provide the temperature information Temp to the control logic 220. The control logic 220 provides a voltage control signal CTRL_vol based on the temperature information Temp, and the voltage generator 230 may generate a trip control voltage Vsoa of which a level is adjusted based on the voltage control signal CTRL_vol. For example, as the temperature of the memory device 10 decreases, the level of the trip control voltage Vsoa may be adjusted in a linear or non-linear manner. In addition, a temperature compensation controller 221 for controlling various compensation operations in the memory device 10 based on the temperature as described above may be provided in the control logic 220, and the temperature compensation controller 221 may include a hardware circuit, software, or a hardware/software combination.

In addition, the memory device 10 shown in FIG. 1 may be referred to as a storage device. For example, the storage device is a device that stores data under the control of a host device such as a computer, a smartphone, a smart pad, or the like. The storage device may be a device that stores data in a semiconductor memory, particularly a nonvolatile memory device, such as a solid state drive (SSD) or a memory card. The storage device may further include a controller (e.g., a memory controller) for controlling the memory device 10, and the controller may control data storage and reading operations for the memory device 10 according to a request from the host device, and as an example, the command CMD, address ADDR, and control signal CTRL described above may be provided by the controller to the memory device 10.

Although it has been described that the temperature sensor is provided in the memory device 10, example embodiments are not limited thereto, and the memory device 10 and receive the temperature information Temp from an external source. Alternatively, the storage device may be implemented such that the memory controller generates information related to a level change of the trip control voltage Vsoa based on the detected temperature and provides the related information to the memory device 10.

Figure 2:
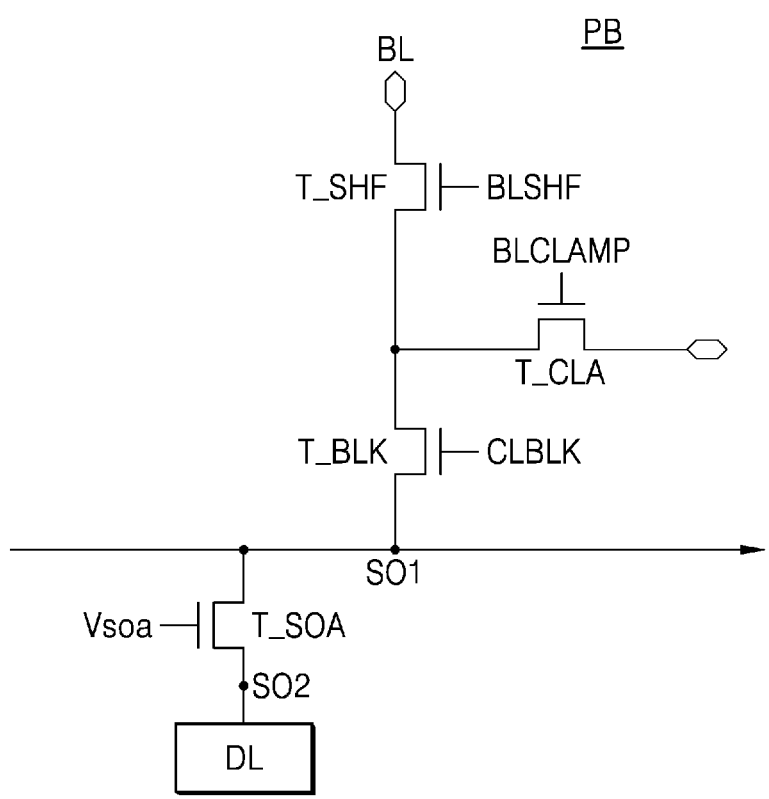
FIG. 2 is a diagram illustrating an implementation example of a page buffer according to an example embodiment.

FIG. 2 is a diagram illustrating an implementation example of a page buffer PB according to an example embodiment. As shown in FIG. 2, the page buffer PB includes transistors and a data latch DL. In addition, the data latch DL may include one or more latches, and may have a configuration corresponding to the sensing latch described above. In addition, the page buffer PB is not limited to the illustrated components, and the page buffer PB may include various other components related to writing and reading data.

Referring to FIGS. 1 and 2, the data latch DL may store data read from a memory cell, and may also store data to be written to the memory cell. Also, the first sensing node SO1 may be precharged during a read, write, or erase operation of the memory device 10. In addition, a shut-off transistor T_SHF and a bit line connection transistor T_BLK may be arranged in series between the bit line BL and the first sensing node SO1, and the shut-off transistor T_SHF may be turned on or off according to the shut-off control signal BLSHF, and the connection control transistor T_BLK may be turned on or off according to the bit line connection control signal CLBLK. In addition, the bit line clamping transistor T_CLA may be connected to a node between the shut-off transistor TSHF and the bit line connection transistor T_BLK, and may apply a preset power voltage to the first sensing node SO1 through the bit line connection transistor T_BLK. In FIG. 2, a case where the shut-off transistor TSHF, the bit line connection transistor T_BLK, and the bit line clamping transistor T_CLA are implemented as N-type transistors is exemplified, but the type of the transistors is not limited thereto.

As described above, the page buffer PB may be differently controlled according to a change in temperature, and a control for adjusting the sensing trip level of the page buffer PB according to the temperature may be applied to the page buffer PB. For example, a trip control transistor T_SOA may be arranged between the first sensing node SO1 and the data latch DL, and a trip control voltage Vsoa may be provided to a gate of the trip control transistor T_SOA. In addition, a node between the data latch DL and the trip control transistor T_SOA may be defined as the second sensing node SO2, and a logic state of data stored in the data latch DL may be based on a voltage level applied to the second sensing node SO2.

If the level of the trip control voltage Vsoa is increased, the sensing trip level of the first sensing node SO1, which may be defined as (Vsoa−Vth), may be increased. That is, according to an example embodiment, when the temperature of the memory device 10 decreases, the level of the trip control voltage Vsoa is increased, and accordingly, the sensing trip level of the first sensing node SO1 is increased. Accordingly, when temperature compensation is performed by increasing the voltage level of the bit line in the case where the temperature of the memory device 10 is lowered, an issue in which the voltage level of the unselected sensing node connected to the unselected bit line becomes higher than the sensing trip level described above may be reduced or prevented.

According to the page buffer PB described above, the page buffer PB has a structure in which a trip control transistor T_SOA including an NMOS transistor is inserted between the data latch DL and the first sensing node SO1, and in this case, the voltage level for flipping the logic state of data stored in the data latch DL may be based on a voltage applied to the second sensing node SO2. In addition, in the structure of the page buffer PB, the capacitance component at the second sensing node SO2 may have a smaller value than the capacitance component at the first sensing node SO1, and a development width (or a voltage margin between an on-cell and an off-cell) at the second sensing node SO2 of the page buffer PB connected to the selected bit line may be greatly secured.

Figure 3:
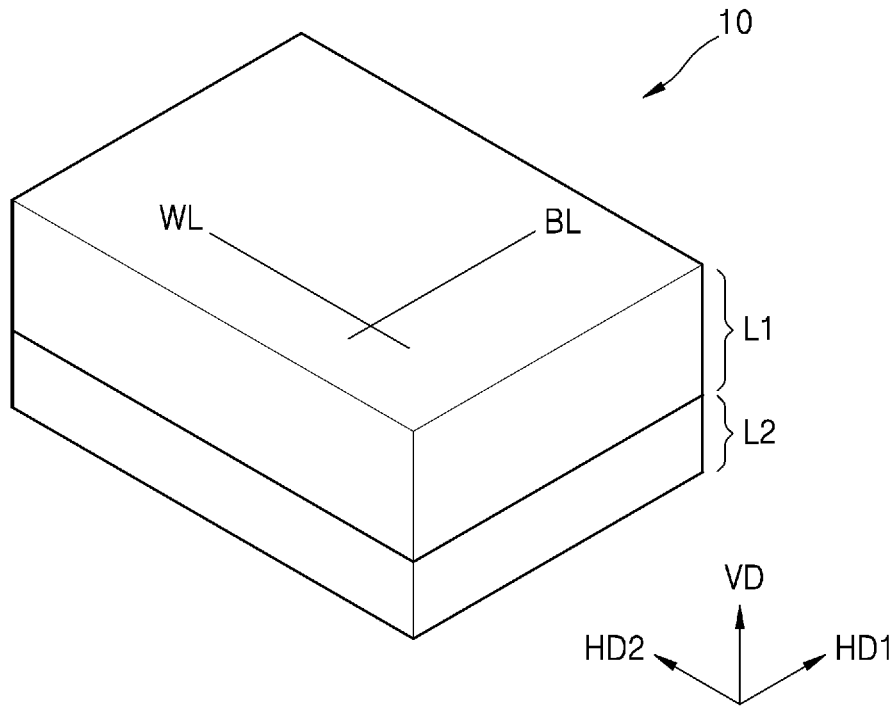
FIG. 3 is a diagram schematically illustrating a structure of the memory device of FIG. 1 according to an example embodiment.
Figure 4:
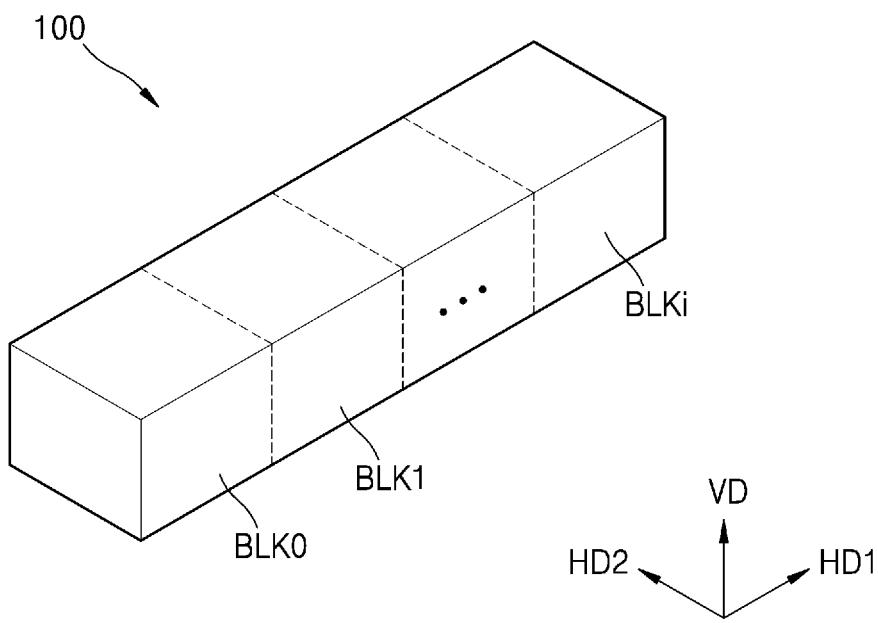
FIG. 4 is a diagram illustrating a memory cell array according to an example embodiment.
Figure 5:
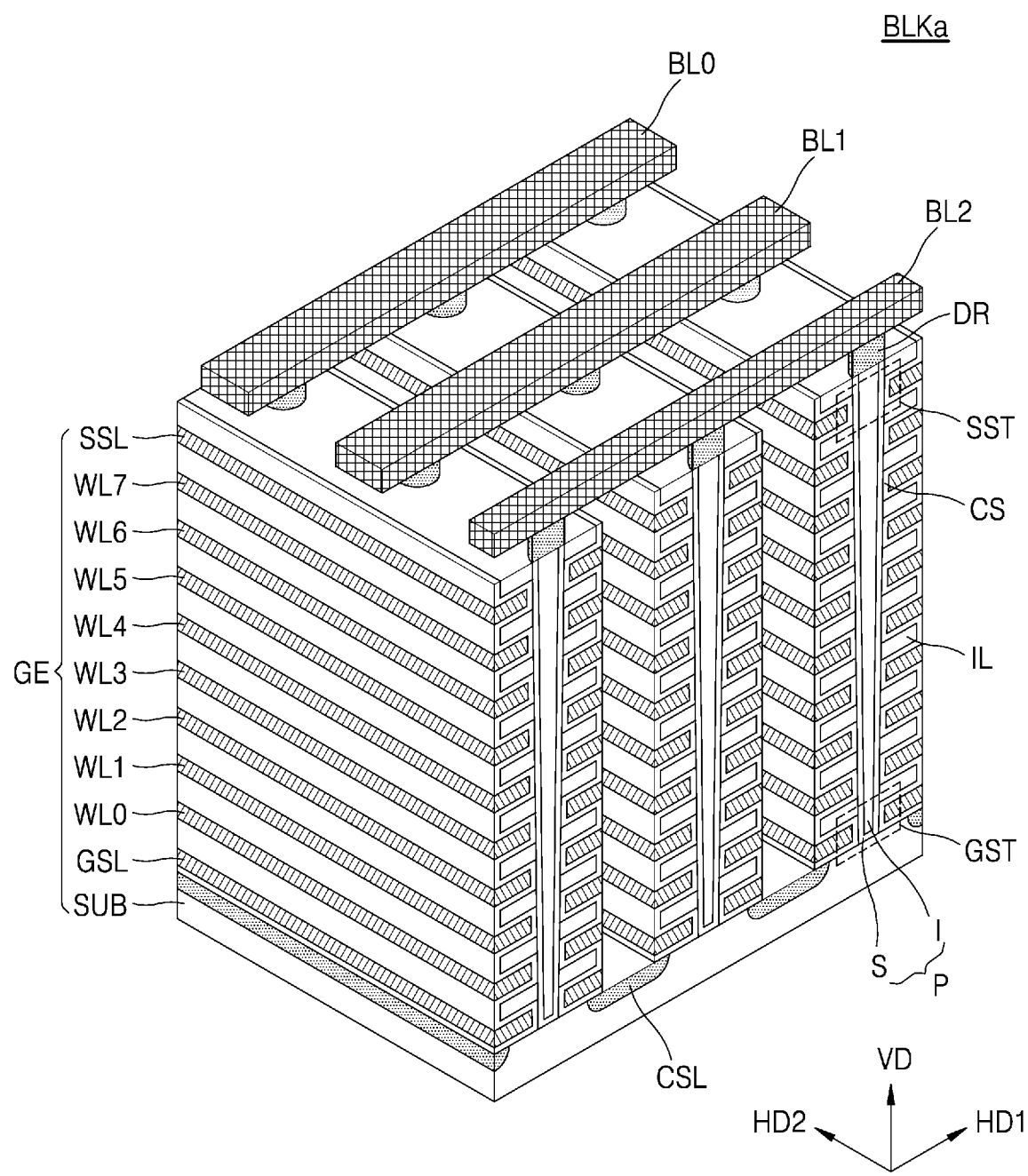
FIG. 5 is a perspective view illustrating structure of a memory block according to an example embodiment.

FIG. 3 is a diagram schematically illustrating the structure of the memory device 10 according to an example embodiment, FIG. 4 is a diagram illustrating the memory cell array 100 according to an example embodiment, and FIG. 5 is a perspective view illustrating an example of the structure of the memory block BLKa according to an example embodiment. In FIG. 3, a cell over periphery (COP) structure is exemplified as an implementation example of the memory device 10, but example embodiments are not limited thereto, and the memory device 10 may be implemented through various structures.

Referring to FIG. 3, the memory device 10 may include a first semiconductor layer L1 and a second semiconductor layer L2, and the first semiconductor layer L1 may be stacked in a direction VD perpendicular to the second semiconductor layer L2. In particular, the second semiconductor layer L2 may be arranged below the first semiconductor layer L1 in a vertical direction VD, and accordingly, the second semiconductor layer L2 may be arranged close to the substrate.

In an example embodiment, the memory cell array 100 of FIG. 1 may be formed in the first semiconductor layer L1, and the peripheral circuit 200 of FIG. 1 may be formed in the second semiconductor layer L2. Accordingly, the memory device 10 may have a structure in which the memory cell array 100 is arranged on the peripheral circuit 200, that is, a COP structure. The COP structure may effectively reduce a horizontal area and improve the degree of integration of the memory device 10.

In one example embodiment, the second semiconductor layer L2 may include a substrate, and the peripheral circuit 200 may be formed in the second semiconductor layer L2 by forming transistors and metal patterns for wiring the transistors on the substrate. After the peripheral circuit 200 is formed on the second semiconductor layer L2, a first semiconductor layer L1 including the memory cell array 100 may be formed, and metal patterns for electrically connecting the word lines WL and bit lines BL of the memory cell array 100 and the peripheral circuit 200 formed in the second semiconductor layer L2 may be formed. For example, the bit lines BL may extend in the first horizontal direction HD1, and the word lines WL may extend in the second horizontal direction HD2.

Referring to FIG. 4, the memory cell array 100 may include a plurality of memory blocks BLK0 to BLKi, where i may be a positive integer. Each of the plurality of memory blocks BLK0 to BLKi may have a three-dimensional structure (or a vertical structure). In particular, each of the plurality of memory blocks BLK0 to BLKi may include a plurality of NAND strings extending in the vertical direction VD. In this case, the plurality of NAND strings may be provided to be spaced apart by a particular distance in the first and second horizontal directions HD1 and HD2. The plurality of memory blocks BLK0 to BLKi may be selected by the row decoder 240 of FIG. 1. For example, the row decoder 240 may select a memory block corresponding to a block address from among the plurality of memory blocks BLK0 to BLKi.

Referring to FIG. 5, memory block BLKa, which may correspond to any of the plurality of memory blocks BLK0 to BLKi, is formed in a vertical direction with respect to a substrate SUB. The substrate SUB has a first conductivity type (e.g., p-type) and extends in the second horizontal direction HD2 on the substrate SUB, and a common source line CSL doped with impurities of a second conductivity type (e.g., n-type) is provided. In the region of the substrate SUB between two adjacent common source lines CSL, a plurality of insulating films IL extending in the second horizontal direction HD2 are sequentially provided in the vertical direction VD, and the plurality of insulating films IL are spaced apart from each other by a particular distance in the vertical direction VD. For example, the plurality of insulating films IL may include an insulating material such as silicon oxide.

In the region of the substrate SUB between two adjacent common source lines CSL, a plurality of pillars P sequentially arranged in the second horizontal direction HD2 and penetrating the plurality of insulating films IL in the vertical direction VD are provided. For example, the plurality of pillars P may penetrate the plurality of insulating films IL to contact the substrate SUB. In particular, a surface layer S of each pillar P may include the first type of silicon material and function as a channel region. In addition, an inner layer I of each pillar P may include an insulating material such as silicon oxide or an air gap.

In a region between two adjacent common source lines CSL, a charge storage layer CS is provided along exposed surfaces of the insulating films IL, the pillars P, and the substrate SUB. The charge storage layer CS may include a gate insulating layer (also referred to as a 'tunneling insulating layer'), a charge trap layer, and a blocking insulating layer. For example, the charge storage layer CS may have an oxide-nitride-oxide (ONO) structure. Also, in a region between two adjacent common source lines CSL, gate electrodes GE such as select lines GSL and SSL and word lines WL0 to WL7 are provided on the exposed surface of the charge storage layer CS.

Drains or drain contacts DR are provided on the plurality of pillars P, respectively. For example, the drains or drain contacts DR may include a silicon material doped with impurities having the second conductivity type. Bit lines BL0 to BL2 extending in the first horizontal direction HD1 and spaced apart from each other by a particular distance in the second horizontal direction HD2 are provided on the drains or the drain contacts DR.

Figure 7:
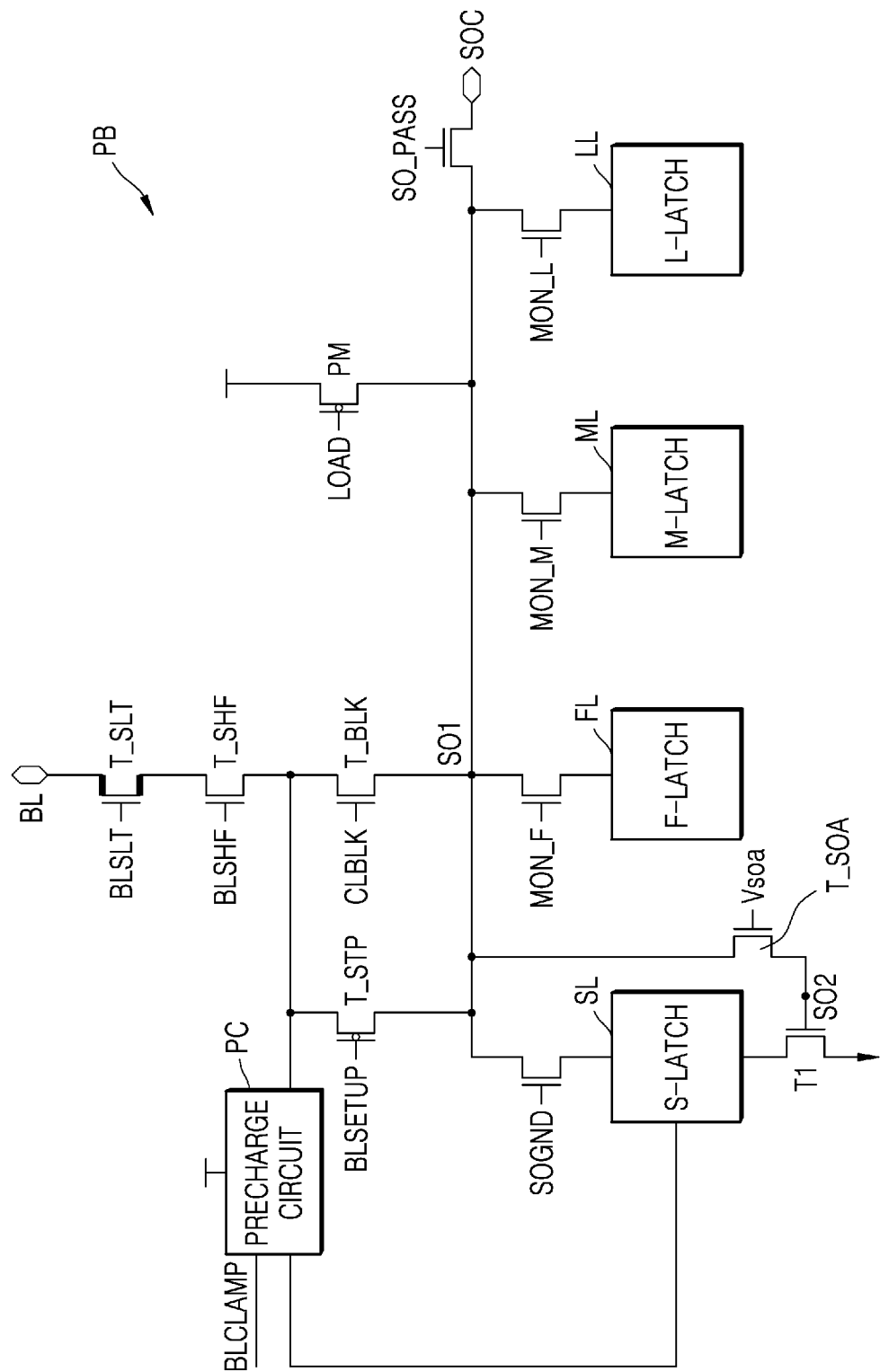
FIG. 7 is a diagram illustrating a page buffer according to an example embodiment.

FIG. 7 is a diagram illustrating a page buffer PB according to an example embodiment. For example, the page buffer PB of FIG. 7 may be implemented in the memory device 10 of FIG. 1. In FIG. 7, the page buffer PB includes a plurality of latches, for example a sensing latch SL, a force latch FL, an upper bit latch ML, and a lower bit latch LL. In addition, the trip control transistor T_SOA according to an example embodiment may be arranged between the first sensing node SO1 and at least one latch. For example, as shown in FIG. 7, the trip control transistor T_SOA is arranged between the first sensing node SO1 and the sensing latch SL. However, example embodiments are not limited thereto, and the trip control transistor T_SOA may also be arranged corresponding to other various types of latches.

According to an example embodiment, the page buffer PB may include a bit line select transistor T_SLT connected to the bit line BL and driven by the bit line select signal BLSLT. The bit line select transistor T_SLT may be implemented as a high voltage transistor. Also, the page buffer PB may further include transistors arranged between the first sensing node SO1 and the latches, and the transistors may be operated according to various control signals SOGND, MON_F, MON_M, and MON_L. In addition, the page buffer PB may further include a precharge circuit PC that controls a precharge operation for the bit line BL or the first sensing node SO1 based on the bit line clamping control signal BLCLAMP, and the precharge circuit PC may include a bit line clamping transistor. In addition, the page buffer PB may further include a setup transistor T_STP driven by the bit line setup signal BLSETUP and a precharge transistor PM driven by the load signal LOAD.

The latches may store a variety of information, and as an example, the sensing latch SL may store data stored in a memory cell or a sensing result of a threshold voltage of the memory cell during a read or program verify operation. In addition, the force latch FL may be utilized to improve threshold voltage distribution during a program operation. In addition, the upper bit latch ML, the lower bit latch LL, and the cache latch may be utilized to store externally input data during a program operation.

In addition, the page buffer PB may further include a shut-off transistor T_SHF and a bit line connection transistor T_BLK connected in series between the bit line select transistor T_SLT and the first sensing node SOL To compensate for the decrease in the value of the current flowing through the memory cell as the temperature decreases, according to an example embodiment, the control logic 220 may control the level of the gate bias of the at least one transistor illustrated in FIG. 7 to be increased. For example, by increasing the level of the gate bias applied to the shut-off transistor T_SHF, the bit line connection transistor T_BLK, and the bit line clamping transistor in the precharge circuit PC as the temperature decreases, the voltage of the bit line BL may be increased.

In addition, the sensing latch SL may include a plurality of transistors together with a latch circuit, and at least one of the plurality of transistors may include a transistor (hereinafter, referred to as a first transistor T1) that is electrically connected to the first sensing node SO1 to change a value of data stored in the latch circuit according to the level of the first sensing node SO1. In an example embodiment, the first transistor T1 may be referred to as a ground transistor in that the first transistor T1 performs a function of connecting a ground voltage to one node of the latch circuit or disconnecting the connection based on the switching thereof. In addition, the trip control transistor T_SOA according to example embodiments is connected between the gate of the first transistor T1 and the first sensing node SO1, and a trip control voltage Vsoa may be provided to the gate of the trip control transistor T_SOA.

When the bit line connected to the page buffer PB is selected, the control logic 220 may control a trip control voltage Vsoa to be provided so that the trip control transistor T_SOA is turned on, and as the first sensing node SO1 is precharged, the second sensing node SO2 may also be precharged. In addition, after precharging is performed, the level of the trip control voltage Vsoa may be adjusted by the control logic 220 according to a temperature change, and as data is sensed in a data sensing period, voltage levels of the first sensing node SO1 and the second sensing node SO2 may be developed according to data stored in the memory cell, respectively.

On the other hand, when the bit line connected to the page buffer PB is unselected, the precharge operation is not performed on the first sensing node SOL Without performing the precharge operation on the first sensing node SO1, the voltage level of the first sensing node SO1 may increase as the level of the gate bias increases according to example embodiments. At this time, the voltage level of the first sensing node SO1 in the page buffer PB connected to the unselected bit line needs to be less than the sensing trip level, and by increasing the level of the trip control voltage Vsoa as the trip control transistor T_SOA is arranged, the sensing trip level may be increased. Accordingly, even if the level of gate bias is increased for temperature compensation, an issue in which the voltage level of the first sensing node SO1 becomes higher than the sensing trip level in the page buffer PB connected to the unselected bit line may be reduced or eliminated.

Figure 8:
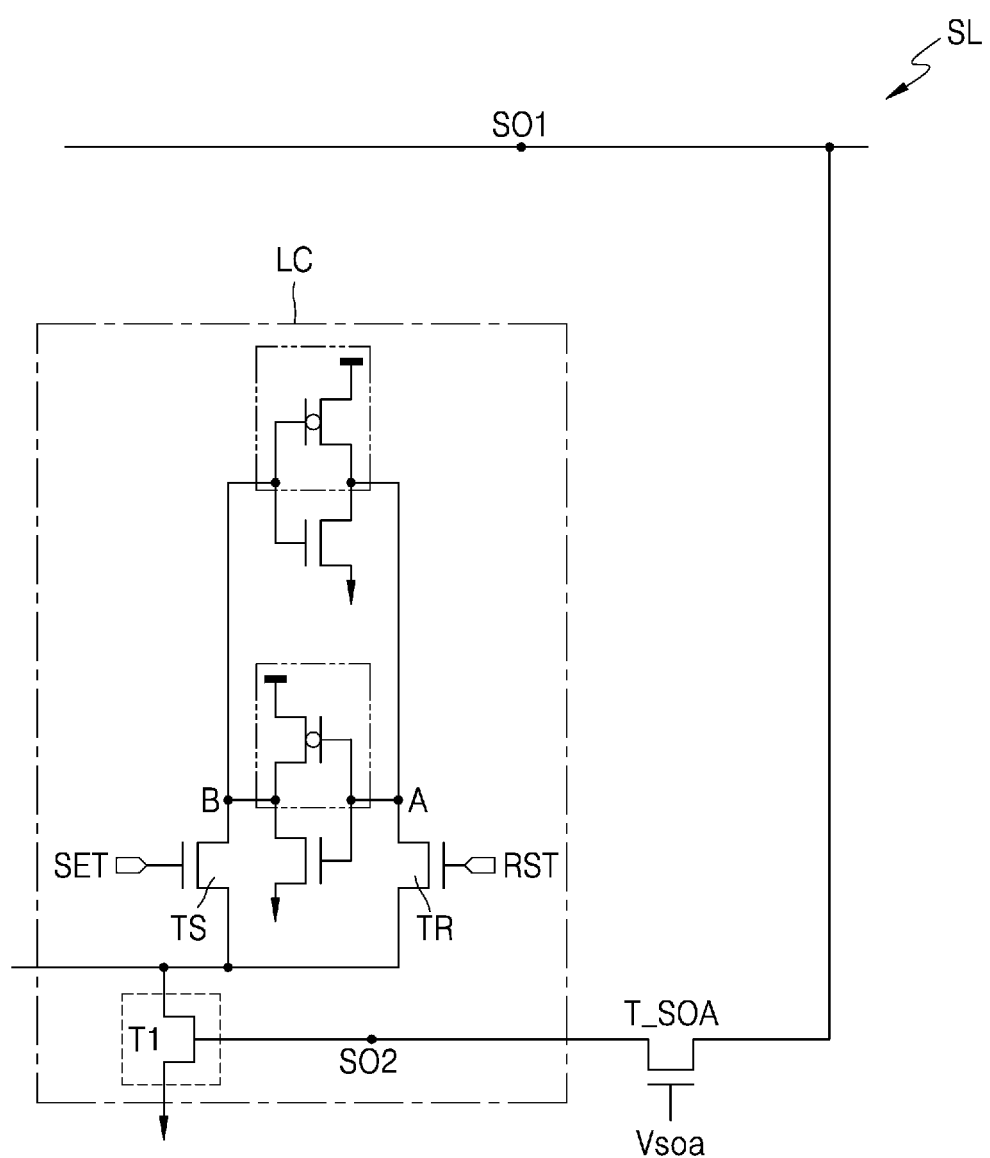
FIG. 8 is a circuit diagram illustrating a sensing latch according to an example embodiment.

FIG. 8 is a circuit diagram illustrating a sensing latch according to an example embodiment.

Referring to FIG. 8, the sensing latch SL may include a latch circuit LC in which inverters are interlocked, and one or more transistors. The logic states of the first node A and the second node B of the latch circuit LC may have complementary states. Also, the logic state of data stored in the latch circuit LC may be flipped by the level of the voltage provided to one of the first node A and the second node B. For example, when the first node A is connected to the ground voltage through the first transistor T1, as the voltage level of the first node A falls to the ground voltage level, the logic state of the data may be flipped, and on the other hand, when the first node A is not connected to the ground voltage, the voltage level of the first node A may be maintained.

In addition, the gate of the first transistor T1 may be connected to the trip control transistor T_SOA, and may be connected to the first sensing node SO1 through the trip control transistor T_SOA. In addition, a node between the gate of the first transistor T1 and the trip control transistor T_SOA may be defined as a second sensing node SO2, and the first transistor T1 may be turned on or off according to the voltage level of the second sensing node SO2. In addition, the sensing latch SL may further include a set transistor TS and a reset transistor TR arranged between the latch circuit LC and the first transistor T1, and a set signal SET may be provided to the gate of the set transistor TS, and a reset signal RST or a sensing enable signal may be provided to the gate of the reset transistor TR.

According to the set signal SET, the set transistor TS may be turned on to set the second node B of the latch circuit LC to the ground level, and accordingly, the latch circuit LC may be initialized. In addition, the reset transistor TR may be turned on according to the reset signal RST, and the first transistor T1 may be turned on or off based on the voltage level applied to the second sensing node SO2. Accordingly, data in a logic state corresponding to the voltage level applied to the second sensing node SO2 may be stored in the latch circuit LC.

In addition, the sensing trip level described above may be related to the switching characteristics of transistors provided in the sensing latch SL shown in FIG. 8, and as an example, may be changed according to characteristics of the PMOS and NMOS transistors included in the sensing latch SL. In this case, the fluctuation range of the sensing trip level may be large due to the characteristics of the PMOS and NMOS transistors, and this indicates that the deviation of the sensing trip level between the page buffers may be large, thereby increasing the possibility of a sensing failure. On the other hand, according to example embodiments, because the sensing trip level may be adjusted by the level of the gate bias of the trip control transistor T_SOA, the fluctuation range of the sensing trip level may be reduced.

Figure 9A:
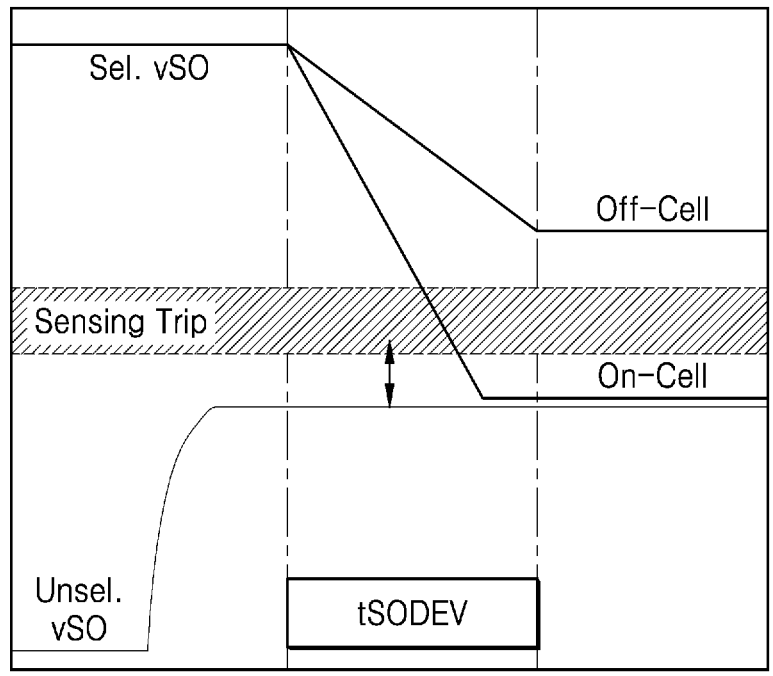
FIGS. 9A and 9B are diagrams illustrating variations in a sensing trip level and a voltage level of a sensing node according to an example embodiment.
Figure 9B:
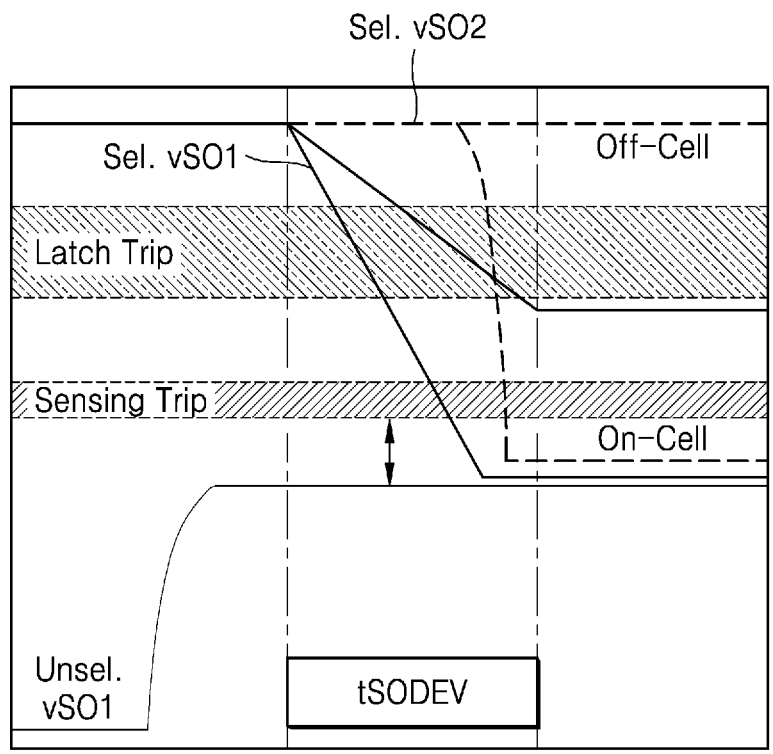

FIGS. 9A and 9B are diagrams illustrating variations in a sensing trip level and a voltage level of a sensing node when an example embodiment is applied.

Referring to FIG. 9A, the sensing node of the page buffer PB connected to the selected bit line may be precharged to a preset level, and the level of the sensing node of the page buffer PB connected to the unselected bit line may be increased according to the power supply voltage connected to the transistors to which the gate bias is applied. The voltage level of the sensing node of the page buffer PB connected to the selected bit line may be changed to a value lower than the sensing trip level depending on whether the memory cell is an off-cell or on-cell in the development period tSODEV.

In addition, the voltage of the sensing node of the page buffer PB connected to the unselected bit line may have a level smaller than the sensing trip level. At this time, there is a limitation in increasing the level of the gate bias to secure a margin between the voltage of the sensing node and the sensing trip level, and accordingly, as the temperature of the memory device decreases, there is a limitation in compensating for the level of the cell current of the memory cell.

As shown in FIG. 9B, in an example embodiment, a first sensing node SO1 and a second sensing node SO2 may be defined, and the second sensing node SO2 may correspond to a node between the trip control transistor and a latch (e.g., a sensing latch). Similar to FIG. 9A, the first sensing node SO1 of the page buffer PB connected to the selected bit line may be precharged to a preset level, and the level of the first sensing node SO1 of the page buffer PB connected to the unselected bit line may be increased according to the power supply voltage connected to the transistors to which the gate bias is applied.

In the page buffer PB, the capacitance at the first sensing node SO1 may be greater than the capacitance at the second sensing node SO2, and when the voltage level of the first sensing node SO1 in the development period tSODEV becomes lower than the sensing trip level, the voltage level of the second sensing node SO2 has a characteristic of falling as shown in FIG. 9B, and in the second sensing node SO2, a relatively large margin between the on-cell and the off-cell may be secured. The sensing trip level shown in FIG. 9B may be controlled by the gate bias level of the trip control transistor, and by increasing the gate bias level as the temperature drops, a larger margin between the voltage of the sensing node of the unselected page buffer PB and the sensing trip level may be secured. In addition, because the latch trip shown in FIG. 9B represents a trip level that may be defined for a sensing latch connected to the trip control transistor and a large margin between the on-cell and the off-cell in the second sensing node SO2 may be secured by the trip control transistor, the level of the latch trip, which is a criterion for data determination in the sensing latch, may be set to a relatively high value.

Figure 10:
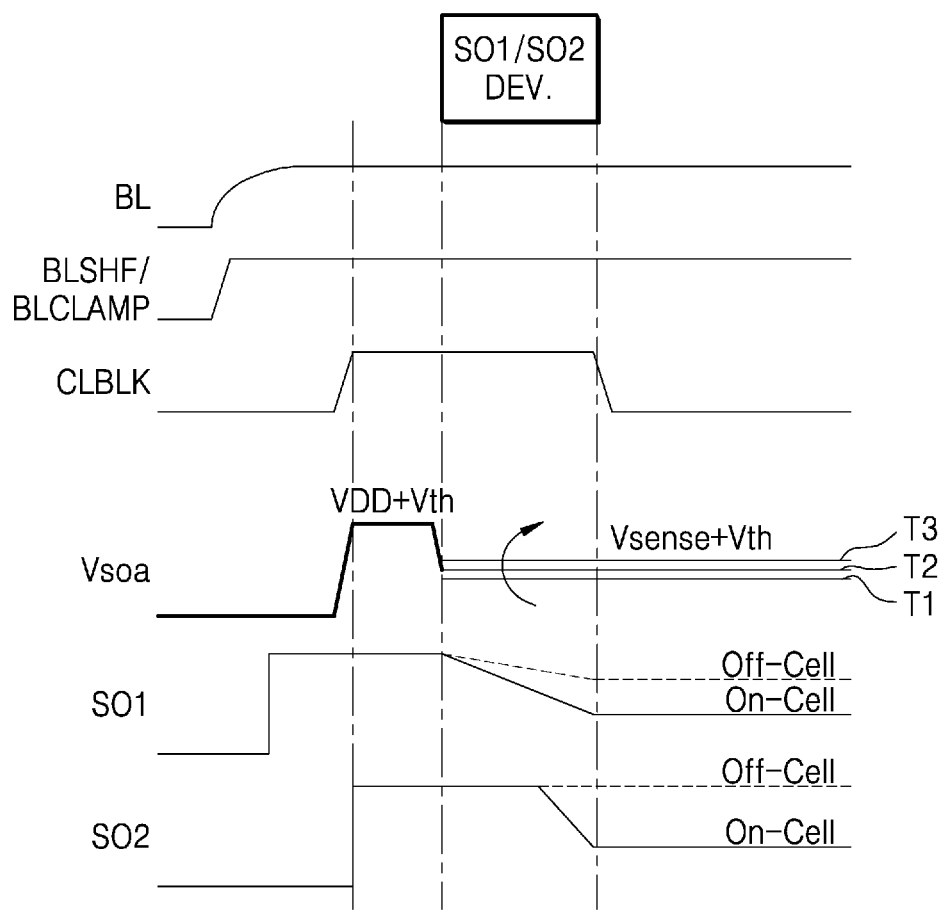
FIG. 10 is a waveform diagram of driving a page buffer according to an example embodiment.

FIG. 10 is a waveform diagram illustrating an example of driving a page buffer according to an example embodiment. FIG. 10 illustrates an example of a change in voltage levels of the first sensing node SO1 and the second sensing node SO2 in the page buffer connected to the selected bit line.

Referring to FIG. 10, as the precharge operation is performed, a bit line clamping control signal BLCLAMP, a shut-off control signal BLSHF, and a bit line connection control signal CLBLK are applied as various gate biases, and the voltage level of the bit line BL may increase. Also, as the first sensing node SO1 is precharged, the voltage of the first sensing node SO1 may have a level corresponding to a precharge level.

In addition, the second sensing node SO2 may be precharged through the first sensing node SO1 and the trip control transistor, and the trip control voltage Vsoa may be controlled to rise to a first voltage level (VDD+Vth) to turn on the trip control transistor. The voltage VDD may be a preset power supply voltage level, and the voltage Vth may be a threshold voltage level of a trip control transistor, and as the trip control transistor is turned on, the second sensing node SO2 may be precharged.

Thereafter, in the development period, the trip control voltage Vsoa may be controlled to drop to a second voltage level (Vsense+Vth) of which a level is controlled to be adjusted based on the temperature (e.g., temperatures T1, T2 and T3 are controlled to different voltages), and voltage levels of the first sensing node SO1 and the second sensing node SO2 may be developed according to data stored in the memory cell. If the memory cell corresponds to an on-cell, the voltage level of the second sensing node SO2 may drop to a level lower than that of the first sensing node SOL Thereafter, in the data sensing period, the bit line connection control signal CLBLK may be changed to a logic low level, and a logic state of data stored in a latch (e.g., a sensing latch) may be changed according to a voltage level applied to the second sensing node SO2.

According to example embodiments, when the temperature of the memory device decreases, the control logic 220 may control the levels of the various gate biases to increase, and the voltage level of the first sensing node SO1 of the page buffer connected to the unselected bit line may increase. In addition, the sensing trip level may increase as the trip control transistor is arranged and the level of the trip control voltage Vsoa rises according to the temperature drop, because a large margin between the voltage level of the first sensing node SO1 and the sensing trip level may be secured, a sensing fail issue that may occur when the voltage level of the first sensing node SO1 of the page buffer connected to the unselected bit line becomes greater than the sensing trip level may be prevented.

Figure 11:
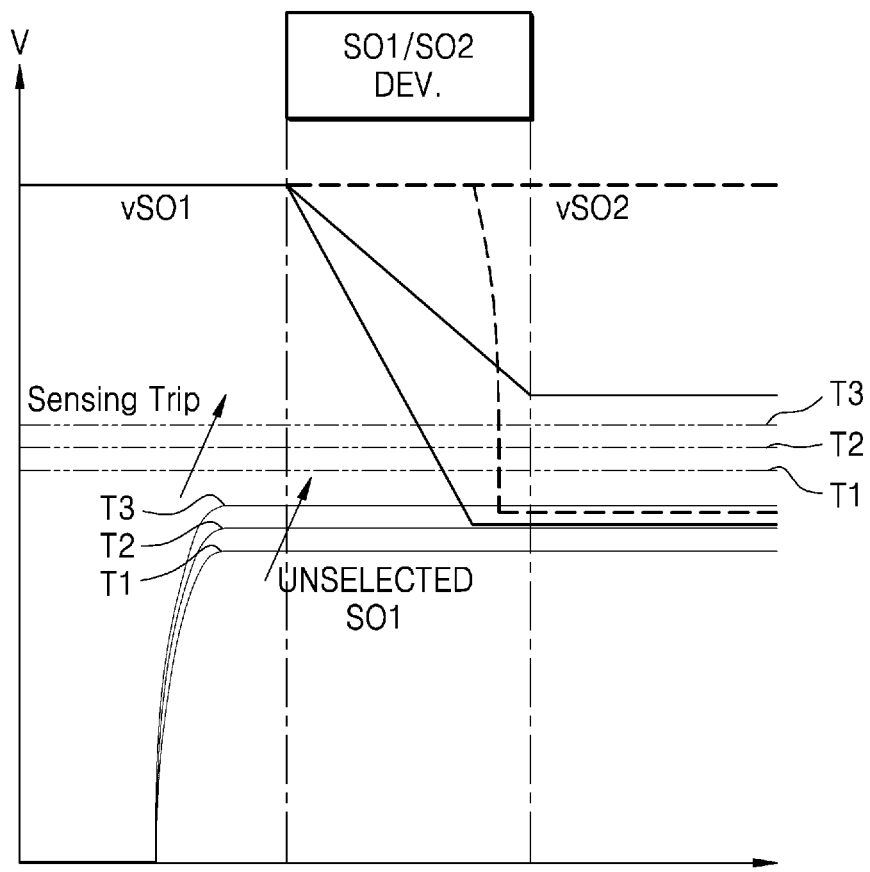
FIG. 11 is a diagram illustrating increasing a level of a gate bias while increasing a sensing trip level when the temperature decreases according to an example embodiment.

FIG. 11 is a diagram illustrating an example of increasing the level of a gate bias while increasing a sensing trip level when temperature decreases. FIG. 11 illustrates the voltage level vSO1 of the first sensing node SO1 and the voltage level vSO2 of the second sensing node SO2 of the page buffer connected to the selected bit line, the voltage level of the first sensing node SO1 of the page buffer connected to the unselected bit line at temperatures T1, T2 and T3, and the sensing trip level at temperatures T1, T2 and T3. For example, the temperature T1 is higher than the temperature T2, and the temperature T2 is higher than the temperature T3.

Referring to FIG. 11, when the temperature of the memory device is relatively high (i.e., temperature T1), the current compensation amount of the memory cell may be relatively small, and accordingly, the control logic 220 may control the levels of various gate biases to have relatively low levels, and accordingly, the voltage level of the first sensing node SO1 of the page buffer connected to the unselected bit line may be relatively low.

On the other hand, when the temperature of the memory device is relatively low (i.e., temperature T3), the current compensation amount of the memory cell needs to be relatively large, and accordingly, the control logic 220 may control the various gate biases to increase. As the various gate bias levels are increased, the voltage level of the first sensing node SO1 of the page buffer connected to the unselected bit line may also increase and therefore have a relatively high value. However, according to example embodiments, the control logic 220 may control the level of the control voltage applied to the gate of the trip control transistor may to rise according to a decrease in temperature, and based on this, the sensing trip level may increase, so that a margin between the voltage level of the first sensing node SO1 and the sensing trip level may be secured, and an issue in which the voltage level of the first sensing node SO1 becomes higher than the sensing trip level may be prevented.

Figure 12:
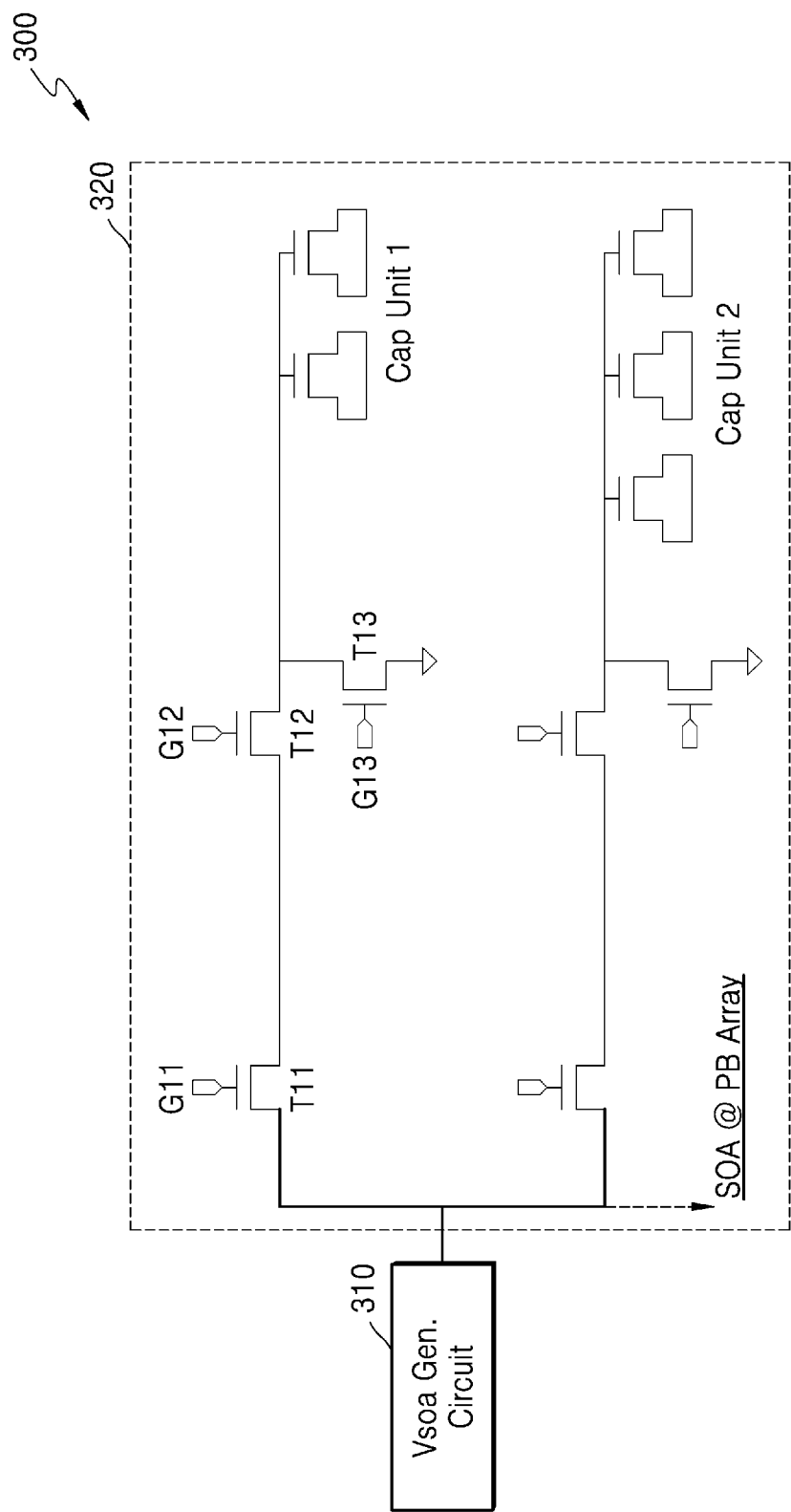
FIGS. 12 and 13 are diagrams illustrating a voltage generator and a corresponding control waveform according to an example embodiment.
Figure 13:
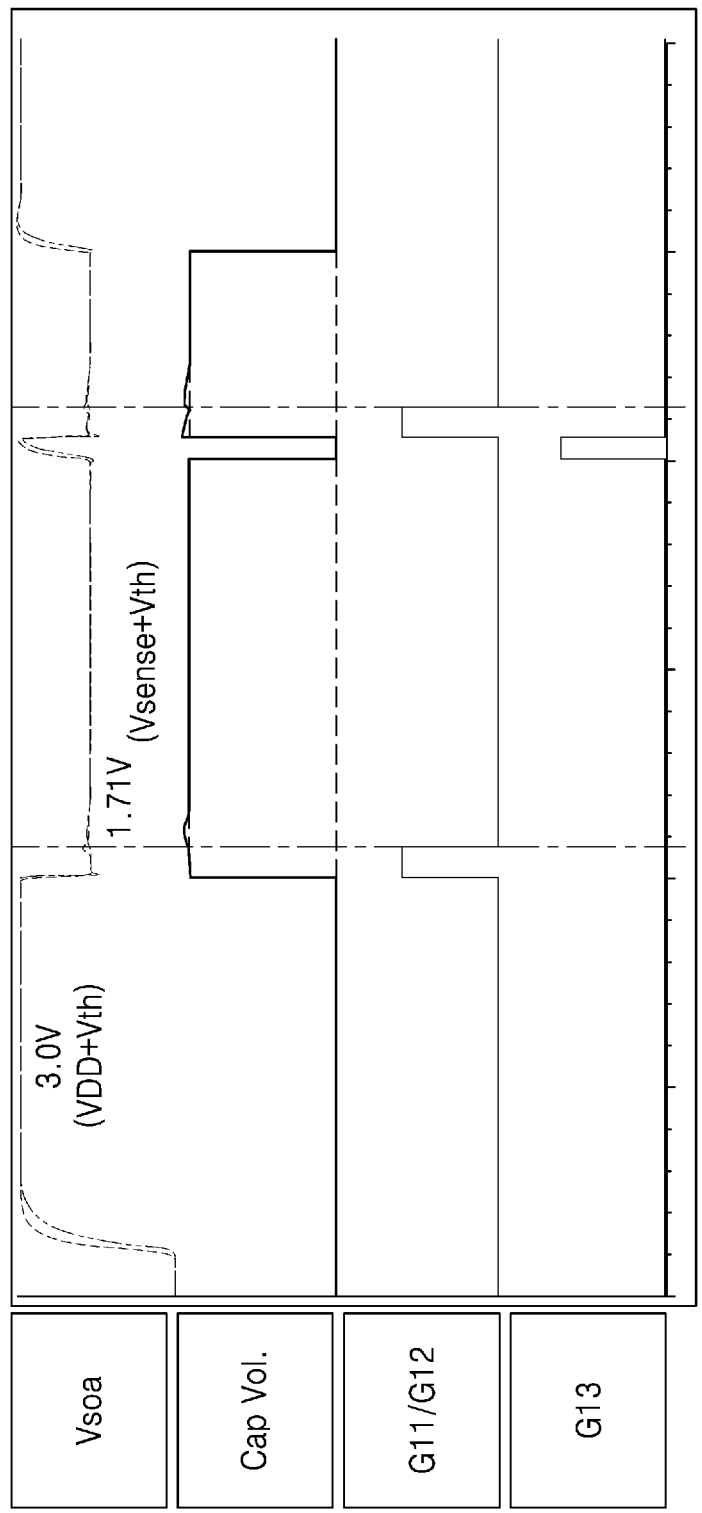

FIGS. 12 and 13 are diagrams illustrating a voltage generator and a corresponding control waveform according to an example embodiment. The voltage generator shown in FIG. 12 may be a voltage generator that generates a trip control voltage Vsoa according to example embodiments.

Referring to FIG. 12, a voltage generator 300 may include a voltage generation circuit 310 and a charge-sharing circuit 320, and may generate a trip control voltage Vsoa according to example embodiments. Also, according to example embodiments, the voltage generator 300 may control a level of the trip control voltage Vsoa to change according to a temperature change of the memory device. As discussed above, to precharge the second sensing node corresponding to one end of the trip control transistor, the trip control voltage Vsoa may be relatively high in the precharge period (e.g., the first level (VDD+Vth) discussed above), and after that, in the development period, the level of the trip control voltage Vsoa needs to be lowered to a preset set level (e.g., the second level (Vsense+Vth) discussed above).

To rapidly lower the level of the trip control voltage Vsoa from the first level (VDD+Vth) to the second level (Vsense+Vth), the voltage generator 300 may further include one or more capacitance units. As shown in FIG. 12, first and second capacitance units are included in the charge-sharing circuit 320, but example embodiments are not limited thereto, and the charge-sharing circuit 320 may include other numbers of capacitance units. That is, the level control characteristic of the trip control voltage Vsoa may vary based on the number of capacitance units included in the charge-sharing circuit 320 and a capacitance value corresponding to each unit.

Also, each of the capacitance units may be connected to one or more transistors, and as an example, the first capacitance unit may be connected to a node to which a trip control voltage Vsoa is provided through first and second transistors T11 and T12. In addition, the third transistor T13 may be arranged between the first capacitance unit and the ground voltage to discharge the first capacitance unit.

An operation related to any one capacitance unit (e.g., the first capacitance unit) shown in FIG. 12 is described with reference to FIG. 13.

A first transistor T11 and a second transistor T12 may be arranged in series between the node to which the trip control voltage Vsoa is provided and the first capacitance unit, and the switching of the first transistor T11 and the second transistor T12 may be controlled according to the first control signal G11 and the second control signal G12, respectively. For example, the first control signal G11 and the second control signal G12 may be provided by the control logic 220. A discharge operation may be performed on one or more capacitors of the first capacitance unit as the third transistor T13 according to the third control signal G13 is turned on.

The voltage generation circuit 310 may provide a trip control voltage Vsoa of a first level (VDD+Vth) during a preset period (e.g., a precharge period), and in the example of FIG. 13, a case where the first level (VDD+Vth) corresponds to about 3.0 V is exemplified. Then, according to example embodiments, in the development period, the level of the trip control voltage Vsoa needs to be quickly lowered from the first level (VDD+Vth) to the second level (Vsense+Vth), and for this, to perform charge sharing between the node to which the trip control voltage Vsoa is provided and the first capacitance unit, the logic states of the first control signal G11 and the second control signal G12 are transitioned to turn on the first transistor T11 and the second transistor T22, and accordingly, the node to which the trip control voltage Vsoa is provided and the capacitors of the first capacitance unit may be electrically connected. Accordingly, the voltage level of the node to which the trip control voltage Vsoa is provided may be quickly lowered to the second level (Vsense+Vth), and in the example of FIG. 13, a case where the second level (Vsense+Vth) corresponds to about 1.71 V is exemplified. Thereafter, the logic states of the first control signal G11 and the second control signal G12 are transitioned to turn off the first transistor T11 and the second transistor T22. Then, the logic state of the third control signal G13 is transitioned and the third transistor T13 is turned on, capacitors of the first capacitance unit may be discharged, and the voltage level of the node to which the trip control voltage Vsoa is provided may be increased. Then, the logic state of the third control signal G13 may be transitioned to turn off the third transistor T13, and the logic states of the first control signal G11 and the second control signal G12 are transitioned to again turn on the first transistor T11 and the second transistor T22.

Figure 14:
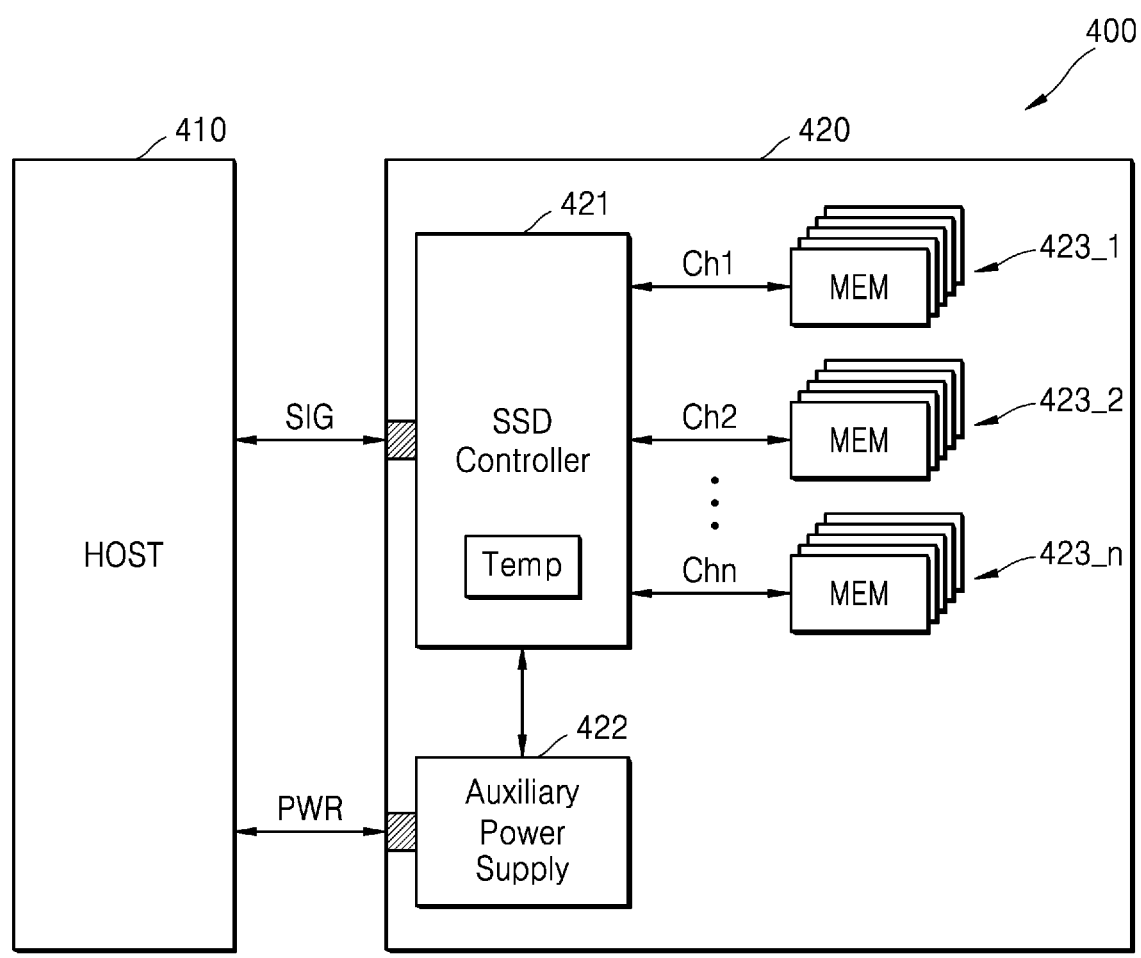
FIG. 14 is a block diagram illustrating a memory device provided in a solid state drive (SSD) system according to an example embodiment.

FIG. 14 is a block diagram illustrating an example in which a memory device according to example embodiments is applied to an SSD system 400.

Referring to FIG. 14, the SSD system 400 may include a host 410 and an SSD 420. The SSD 420 exchanges signals with the host 410 through a signal connector, and receives power through a power connector. The SSD 420 may include an SSD controller 421, an auxiliary power supply 422, and memory devices 423_1 to 423_n. The memory devices 423_1 to 423_n may be vertically stacked NAND flash memory devices. In this case, the SSD 420 may be implemented using example embodiments described above with reference to FIGS. 1 to 13. That is, in relation to each of the memory devices 423_1 to 423_n included in the SSD 420, a trip control transistor according to example embodiments may be arranged in a page buffer, and the level of the trip control voltage provided to the gate of the trip control transistor may be controlled based on the temperature detection result in the SSD system 400 to control temperature compensation to be performed. In FIG. 14, a case where the SSD controller 421 includes a temperature sensor is exemplified, and as the SSD controller 421 provides temperature sensing information to the SSD 420, the level of the trip control voltage inside the SSD 420 may be adjusted. Example embodiments are not limited thereto, and the temperature sensor may be provided in other locations.

While aspects of example embodiments have been particularly shown and described, it will be understood that various changes in form and details may be made therein without departing from the spirit and scope of the following claims.

What is claimed is:

1. A memory device comprising:
a memory cell array including a plurality of memory cells;
a page buffer circuit connected to the memory cell array through a plurality of bit lines and comprising a page buffer connected to each of the plurality of bit lines, the page buffer comprising at least one first latch for storing data based on a voltage level of a first sensing node; and
a control circuit configured to adjust a level of a voltage signal provided to the page buffer circuit,
wherein the page buffer further comprises a trip control transistor arranged between the at least one first latch and the first sensing node, and
wherein the control circuit is further configured to, based on a read operation being performed on the memory cell array, control a trip control voltage to be provided to a gate of the trip control transistor, and control a level of the trip control voltage to vary according to a temperature of the memory device.

2. The memory device of claim 1, wherein a sensing trip level of the page buffer corresponds to a difference between a threshold voltage level of the trip control transistor and a level of the trip control voltage, and
wherein the control circuit is further configured to increase the level of the trip control voltage as the temperature decreases.

3. The memory device of claim 2, wherein the page buffer further comprises at least one transistor arranged between the first sensing node and a bit line, and
wherein the control circuit is further configured to control a level of a gate bias applied to the at least one transistor to increase as the temperature decreases.

4. The memory device of claim 3, wherein, based on the page buffer being connected to an unselected bit line, a voltage level of the first sensing node of the page buffer is lower than the sensing trip level.

5. The memory device of claim 3, wherein a second sensing node is provided between the at least one first latch and one electrode of the trip control transistor, and
wherein, based on the page buffer being connected to a selected bit line, the second sensing node is precharged through the first sensing node and the trip control transistor.

6. The memory device of claim 5, wherein, when the page buffer is connected to the selected bit line, during a development period for the first sensing node, a voltage level difference between an on-cell and an off-cell of the second sensing node is greater than a voltage level difference between an on-cell and an off-cell of the first sensing node.

7. The memory device of claim 5, wherein, during a precharge period, the trip control voltage has a first level to control the trip control transistor to electrically connect the first sensing node with the second sensing node, and
wherein, during a development period, the level of the trip control voltage is decreased to a second level that varies according to the temperature.

8. The memory device of claim 7, further comprising a voltage generator configured to provide the trip control voltage to the trip control transistor,
wherein the voltage generator comprises a voltage generation circuit configured to generate the trip control voltage, and a capacitance circuit connected to a first node to which the trip control voltage is provided through one or more transistors, and
wherein the control circuit is further configured to control, in a process in which the level of the trip control voltage is decreased from the first level to the second level, the one or more transistors to turn on and electrically connect the first node and the capacitance circuit.

9. The memory device of claim 1, wherein the at least one first latch comprises a latch circuit configured to store data in a according to a voltage level of the first sensing node, and a first transistor connected between the latch circuit and a ground voltage, and wherein a gate of the first transistor is connected to the first sensing node through the trip control transistor.

10. The memory device of claim 1, wherein the memory device comprises vertical NAND memory cells.

11. A page buffer of a memory device, wherein the page buffer is arranged to correspond to a first bit line of a plurality of bit lines of the memory device, and comprises:

a first latch configured to latch data based on a voltage level of a first sensing node of the page buffer;

a shut off transistor connected to the first bit line and configured to operate based on a shut-off control signal;

a bit line connection transistor arranged between the shut off transistor and the first sensing node and configured to operate based on a bit line connection control signal;

a bit line clamping transistor arranged between a first node and a power supply voltage, wherein the bit line clamping transistor is configured to operate based on a bit line clamping control signal, and the first node is arranged between the shut off transistor and the bit line connection transistor; and a trip control transistor arranged between the first latch and the first sensing node, and configured to operate based on a trip control voltage, wherein the page buffer is configured to control, as a temperature of the memory device decreases, a level of any one or any combination of the shut-off control signal, the bit line connection control signal, and the bit line clamping control signal to increase, and wherein the page buffer is configured to control, as the level of the trip control voltage increases, a sensing trip level of the page buffer to increase.

12. The page buffer of claim 11, wherein the sensing trip level corresponds to a difference between a threshold voltage level of the trip control transistor and the level of the trip control voltage.

13. The page buffer of claim 12, wherein, based on the first bit line being an unselected bit line, the page buffer is configured to increase the voltage level of the first sensing node as a level of any one or any combination of the shut-off control signal, the bit line connection control signal, and the bit line clamping control signal increases, and wherein the voltage level of the first sensing node is lower than the sensing trip level.

14. The page buffer of claim 11, wherein the page buffer comprises a latch circuit configured to store data based on the voltage level of the first sensing node, and a first transistor connected between the latch circuit and a ground voltage, and wherein a gate of the first transistor is connected to the first sensing node through the trip control transistor.

15. The page buffer of claim 11, wherein a second sensing node is arranged between the first latch and one electrode of the trip control transistor, and wherein the page buffer is configured to, based on the first bit line being a selected bit line during a precharge period of the page buffer, precharge the second sensing node through the first sensing node and the trip control transistor.

16. The page buffer of claim 15, wherein during the precharge period of the page buffer, the trip control voltage has a first level such that the second sensing node is precharged, and wherein, during a development period of the page buffer, a level of the trip control voltage is decreased to a second level that varies according to the temperature.

17. A memory device comprising:

a memory cell array comprising a plurality of memory cells;

a page buffer circuit connected to the memory cell array through a plurality of bit lines and comprising a page buffer connected to one of the plurality of bit lines, the page buffer comprising at least one first latch configured to store data based on a voltage level of a sensing node; and a control circuit configured to adjust a level of a voltage signal provided to the page buffer circuit, wherein the page buffer further comprises one or more transistors connected between a corresponding bit line and the sensing node, and a trip control transistor arranged between the sensing node and the at least one first latch, and wherein the control circuit is further configured to, as a temperature of the memory device decreases, control a level of a trip control voltage applied to a gate of the trip control transistor to increase.

18. The memory device of claim 17, wherein the control circuit is further configured to, as the temperature of the memory device decreases, increase the trip control voltage, and wherein a voltage level applied to a sensing node of the page buffer connected to an unselected bit line is lower than a sensing trip level.

19. The memory device of claim 17, wherein the at least one first latch comprises a latch circuit configured to store data according to a voltage level of the sensing node, and a first transistor connected between the latch circuit and a ground voltage, and wherein a gate of the first transistor is connected to the sensing node through the trip control transistor.

20. The memory device of claim 19, wherein, during a precharge period of the page buffer circuit, the trip control voltage has a first level to control the trip control transistor to electrically connect the sensing node with another sensing node arranged between the at least one first latch and the trip control transistor, and wherein, during a development period of the page buffer circuit, a level of the trip control voltage is decreased to a second level that varies according to the temperature.

* * * * *